United States Patent
Langbein et al.

[19]

[11] Patent Number: 6,136,756
[45] Date of Patent: *Oct. 24, 2000

[54] METHOD FOR MANUFACTURING OF HIGH TEMPERATURE SUPERCONDUCTOR MATERIAL

[75] Inventors: Gerhard Langbein, Arzberg-Adelwitz; Frank Werfel, Leipzig, both of Germany

[73] Assignee: Adelwitz Technologiezentrum GmbH, Adelwitz, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/494,254

[22] Filed: Jun. 23, 1995

[30] Foreign Application Priority Data

Nov. 30, 1993 [DE] Germany .......................... 93 18 197 U

[51] Int. Cl.$^7$ .................................................. H01L 39/24

[52] U.S. Cl. ......................... 505/450; 505/451; 505/500; 29/599

[58] Field of Search ..................... 505/500, 320, 505/300, 450, 451; 29/599

[56] References Cited

U.S. PATENT DOCUMENTS

| | | | |
|---|---|---|---|
| 4,981,839 | 1/1991 | Kieser | 505/500 X |
| 5,231,076 | 7/1993 | Jeong et al. | 505/500 X |
| 5,262,391 | 11/1993 | Morita et al. | 505/451 |

FOREIGN PATENT DOCUMENTS

| | | | |
|---|---|---|---|
| 565415 A2 | 10/1993 | European Pat. Off. | 505/450 |
| 5279031 | 10/1993 | Japan | 505/450 |

OTHER PUBLICATIONS

"YBaCuO Large Scale Melt Texturing in a Temperature Gradient", Werfel, et al, Jul. 3, 1997.
"Melt Processing of Bulk Tc Superconductors . . . ", Murakami, et al, Sep. 24, 1990.
"Melt Processing of YBaCuO Superconductors and Critical Currents", Murakami, et al., Dec. 4, 1989.
"Modified Melt Texturing Process for YBCO based on the Polymeric Section . . . ", Krabbes, et al, Dec. 22, 1994 EUCAS, p. 333–336, Oct. 1993, Goethingem, Germany.

*Primary Examiner*—Joseph M. Gorski
*Attorney, Agent, or Firm*—Michael J. Striker

[57] ABSTRACT

The high temperature superconducting material is made from a base material having two opposing surfaces and including a high purity yttrium barium copper oxide compound having a $YBa_2Cu_3O_{7-x}$ (123) composition with silver oxide. The method of making the superconducting material includes controlling a temperature of each opposing surface of the base material to form a time-dependent spatial temperature gradient across the base material; measuring the time-dependent spatial temperature gradient, determining whether it is within a desired range and controlling it so that the time-dependent spatial temperature gradient remains within the desired range, thereby melt-texturing the base material while decomposing the silver oxide into silver and transforming the base material into quasi-crystalline superconducting regions having $YBa_2Cu_3O_{7-x}$ (123) composition, intrinsically non-superconducting material zones consisting of coherent yttrium-rich material having a $Y_2BaCuO_5$ (211) composition, and copper-enriched interfacial layers between the quasi-crystalline superconducting regions and the non-superconducting material zones, thereby providing a superconductive material, and then cooling the superconductive material, thereby providing a superconducting material having silver inclusions, the superconducting material having the quasi-crystalline superconducting regions separated from the non-superconducting material zones by the copper-enriched interfacial layers, wherein the copper-enriched interfacial layers function as Pinning centers. A new magnetic bearing based on the superconducting material is also described.

6 Claims, 12 Drawing Sheets

$F = m\, dH/dz$
$M = Mv$
$M = A\, J_0 r$

METHOD FOR MANUFACTURING OF HIGH TEMPERATURE SUPERCONDUCTOR MATERIAL

BACKGROUND OF THE INVENTION

The present invention relates to a method of making a high temperature superconductor material for magnetic field producing devices, particularly for bearings, conveying devices, communication devices, medical devices for medical diagnosis and electronic and electrical devices.

The development of new superconducting materials for practical engineering applications is essentially determined by the wide availability of relevant test materials of reproducible quality.

In the manufacture of solid material with higher critical current densities a series of individual problems arises, for example, grain boundaries, texture effects and microcracks. The stepwise solution of these material science problems allows improvement of the important parameters for various applications, such as critical current density $J_c$, critical magnetic field strength $B_c$ and the attainable macroscopic volume force $F_z$. Different process technologies are used for making superconducting solid samples (sintering processes, crystal cultivation or growth and sol-gel processes).

Manufacturing processes characterized by a direct solidification of material in a temperature gradient to obtain higher critical current densities—an important prerequisite for use of these materials in practical applications—are advantageous.

The development of new materials for practical applications has been based on striving toward two fundamental goals:

reducing the granularity of materials by growing larger quasi-crystals(ceramo-crystals); and reducing flux creep of magnetic vortices in Shubnikov phase by building an effective adherence center (Pinning center). For example deposits, defects and foreign atoms can provide an effective Pinning center. They have frequently a hundred-fold higher Pinning self-energy than those of single crystals.

The preparation of textured solid materials, some by the MTG-process(Melt-textured Growth) according to S. Jin, et al, Phys.Rev. B37, 7850(1988) and K. Salama, et al, Appl.Phys.Lett 54, 2352(1989) or the QMG technique (Quench and Melt Growth) suggested by Japanese Scientific Art and/or the MPMG method (Melt Powder Melt Growth) according to M. Murakami, et al, IEEE Trans. Magn. 27, 1479(1991), provides YBaCuO samples with current densities of under $10^4 A/cm^2$ at a temperature of 77 K and B=1 Tesla. The geometric grain size and/or the size of the quasi-crystals is the second important parameter besides critical current density which determines the effectiveness of a superconducting material for a levitation application.

SUMMARY OF THE INVENTION

It is an object of the present invention to provide a method of making new superconducting materials for practical applications with the following structural properties:

high degree of textured structure;

reduced grain boundaries, larger quasi-crystals (2–3 cm);

presence of effective Pinning centers; and high density, small microcracks.

According to the invention, the method of making a high temperature superconductor material for a magnetic field generating device, the high temperature superconductor material having a multiphase yttrium barium copper oxide composition and having a melt-textured structure, comprises the steps of:

a) adding silver inclusions to a base material having the multiphase yttrium barium copper oxide composition;

b) using a high purity yttrium barium copper oxide compound, $YBa_2Cu_3O_{7-x}$, with x=0.03 to 0.07, as the base material, and c) embedding intrinsically nonsuperconducting material zones in the base material to form the high temperature superconducting material.

In preferred embodiments of the invention the method also can include providing a portion of the base material with two opposing surfaces and controlling a temperature of the base material on each of the surfaces separately to provide an optimum temperature gradient of from 30 to 60 K/cm across that portion of the base material. The method can also further comprise measuring a time dependent temperature profile of the base material with a differential-thermal analysis device and adjusting the temperature profile in a growth oven. The high purity yttrium barium copper oxide compound advantageously has coherent yttrium-rich material zones having a $Y_2BaCuO_5$ (211) composition and the coherent yttrium-rich material zones are intrinsically nonsuperconducting material zones. The high purity yttrium barium copper oxide compound is advantageously isotopically pure. Advantageously quasi-crystalline superconductor regions are formed in the high temperature superconducting material so that the high temperature superconducting material has a critical current density of $3 \times 10^4$ ampere per square centimeter at a temperature of 77 K and in an external magnetic field of one Tesla.

In other embodiments of the invention the high temperature superconducting material is used to form a molded body, a copper or aluminum mounting member is provided for the molded body, and the molded body is maintained in a form minimizing processing work. Cracks, slots and hollow spaces between the molded body and the mounting member can be filled with a resin. The molded body advantageously has a ratio of diameter to height of from four to one.

In further embodiments of the invention an amorphous interfacial layer of about 10 nanometers copper oxide is provided between the base material and the $Y_2BaCuO_5$ (211) composition to eliminate mechanical strains and stresses and to provide an effective Pinning center for a magnetic flux. The electrically and mechanically stabilizing superconducting thin layer systems can be provided comprising portions of the high temperature superconducting material with amorphus interfacial layers made from copper oxide of a 100 nanometer thickness. A pre-treated initiating powder with a grain size of not greater than one micrometer can be used for homogenizing and refining the material zones having the $Y_2BaCuO_5$ (211) composition used as the intrinsically nonconducting superconducting zones. The initiating powder can be mechanically alloyed in many steps until a compact body develops.

BRIEF DESCRIPTION OF THE DRAWING

The objects, features and advantages of the present invention will now be illustrated in more detail by the following detailed description, reference being made to the accompanying drawing in which.

DESCRIPTION OF THE PREFERRED EMBODIMENTS

1. YBaCuO Material from Direct Solidification

Figure 1:
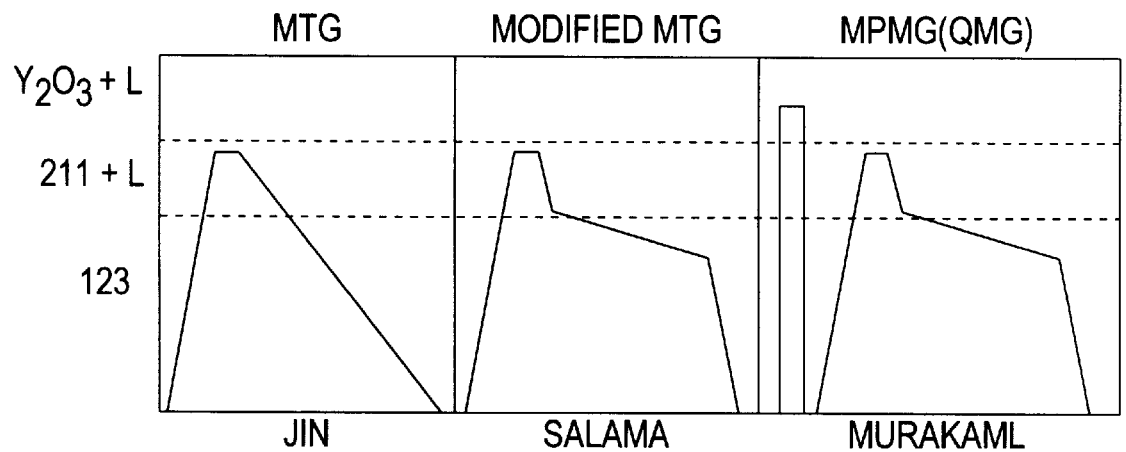
FIG. 1 includes three graphical illustrations illustrating the differing temperature-time evolution behavior in different melt texture processes, the MTG, modified MTG and MPMG(QMG) methods, with Y:Ba:Cu=1:2:3 for the MTG and modified MTG process and with Y:Ba:Cu=1.8:2.4:3.4 for the MPMG method.

All processes for direct solidification of the melt are based on the concept of alignment and/or orientation of microstructure regions in expensive and time intensive melting and cooling processes. FIG. 1 shows the time dependence of temperature (on the Y-axis) of three of the prior art processes, including the MTG process of S. Jin; the modified MTG process of K. Salama; and the MPMG process of M. Murakami. These processes are described in the prior art references cited in the background section above.

Figure 2:
FIG. 2 is a micrograph of the CCG surface taken by scanning electron microscope, dark region: (123) matrix and bright region: another phase, e.g. (211)

Besides the desired texture degree for the superconductor materials the Pinning center plays a key role in obtaining the high current densities. The green phase, $Y_2BaCuO_5$ (211)— finely divided—is regarded as important by the Japanese groups primarily as a potential Pinning center for the Pinning of magnetic flux tubes. Secondary electron micrographs and X-ray photographs show in micrometer dimensions the distribution of green phase (211) in the (123) matrix (see FIG. 2).

There is considerable controversy regarding the operation and effectiveness of the (211) phase as a Pinning center. This is discussed for example in the following journal articles, S. Jin, et al, Appl.Phys. Lett. 59 (1991) and P. J. McGinn, et al, Appl.Phys.Lett. 59, 120(1991). According to the simplified model concept regarding the possible Pinning mechanisms the inner boundary surfaces between the (211) deposits and the (123) matrix are effective as a Pinning center by microscopic potential states.

Transmission electronic microscopy (TEM) tests in the nm region (see FIG. 3) of samples of melt-textured YBaCuO samples show the existence of different microscopic structure defects such as dislocations, defects or microcracks. Some high resolution analytical electron microscopy experiments (AEM) performed on CCG samples show the existence of twin planes and domains. These structural inhomogeneities can contribute to Pinning behavior in new melt-textured superconductor materials, without which up to now a prioritizing of individual phenomenon with especially large Pinning forces is recognizable. Generally the dependence of the effectiveness of the (211)-phase as a Pinning center on the size of deposits of this type, is observed, particularly that homogeneous distribution of small (211) inclusions qualitatively improves the Pinning behavior. Meantime new results have suggested the existence of a very thin interfacial layer of $CuO_x$ between the (123) and (211) phases. This layer can provide an important function in Pinning mechanisms both structurally and chemically for improvement of the Pinning properties.

Ogawa, et al, report in Physica C177, 101(1991) that the (211) deposits can be regulated by addition of Pt. A different size distribution of the (211) regions should be obtained by the use of Pt vessels in the MPMG melt texturing process as described in the article by M. Murakami, et al, in Adv. in Superconduct. IV, Hayakawa, Koshizuka(Eds.), Spring Verlag, Tokyo, 1992. According to these ideas Pt should dissolve into the solution. The Pt concentration is given as 0.3 to 0.5% by weight. Other workers express doubts regarding this Pt mechanism's influence on the (211) grain size (see particularly, S. Nagaya, et al, IEEE Trans.Magn. 27, 1487(1991)).

3. Phase Diagram and Ceramo Crystal Growth(CCG)-Process

Figure 3:
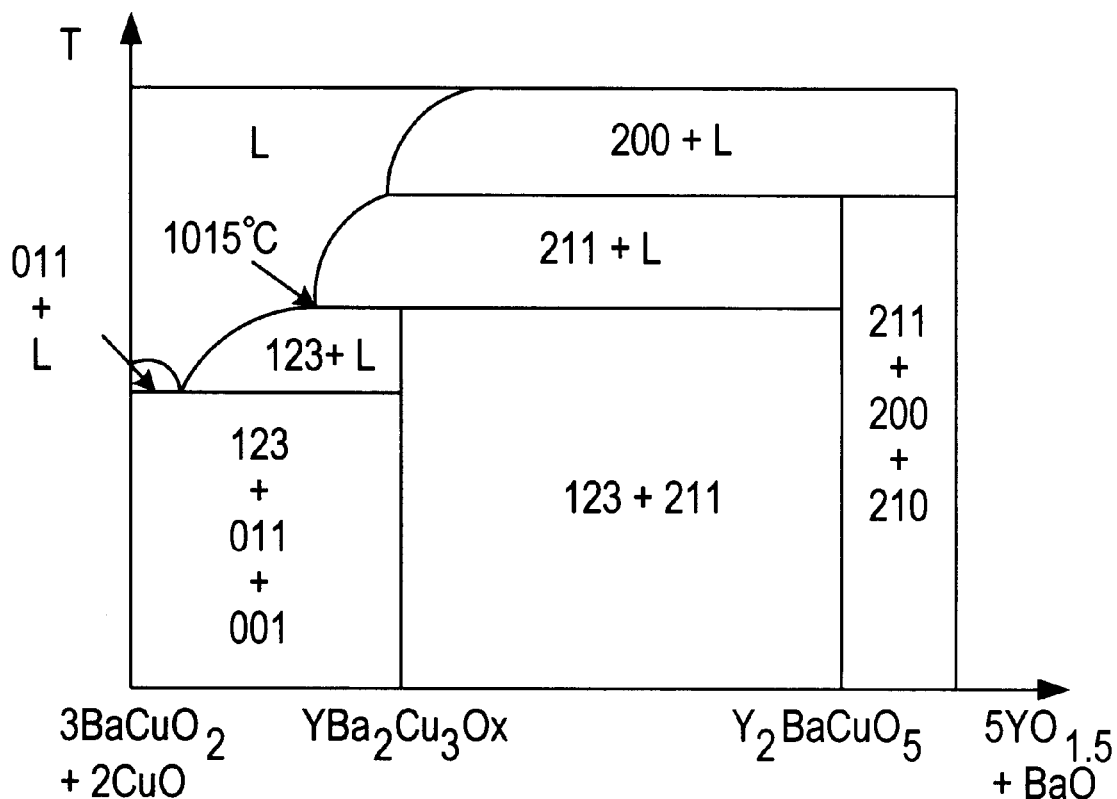
FIG. 3 is a pseudo-binary phase diagram of the YBaCuO system (211)/(123)

The pseudo-binary phase diagram of the YBaCuO system for both phases (211) and (123) is shown in FIG. 3.

The superconducting (123)-phase arises by the following reactions:

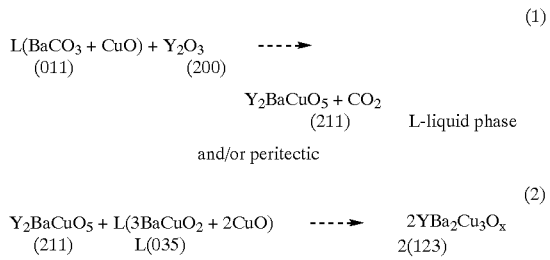

and/or peritectic

Figure 4:
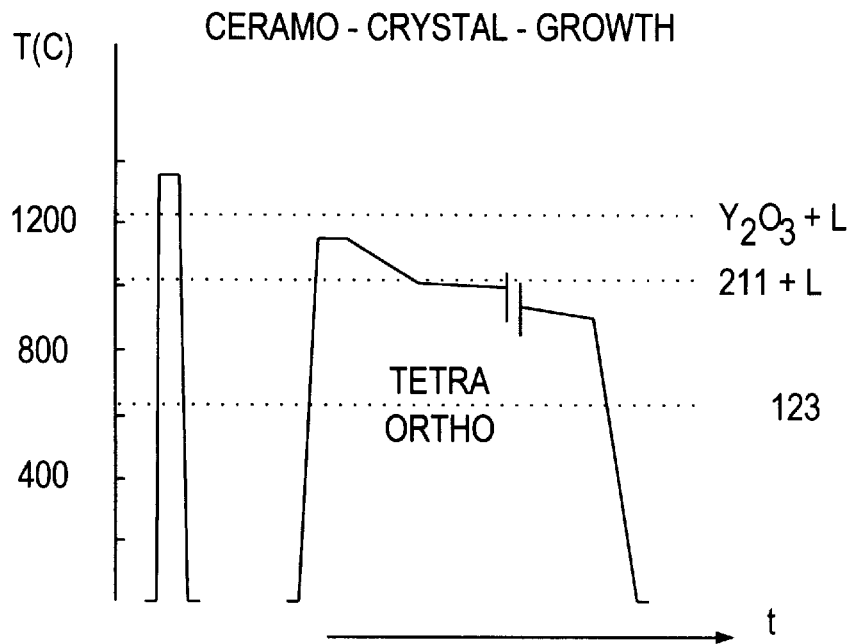
FIG. 4 is a graphical illustration of the time change of temperature during the CCG(Ceramo crystal growth) process.

The ceramo crystal growth method attempts to control the size and distribution of the (211)-phase by additional reaction steps, e.g. using finely divided $Y_2O_3$ nuclei. Furthermore besides the special pretreated initiating powder a special temperature control contributes to the partial melting and cooling and the controlled temperature change is shown in FIG. 4.

The entire process for melt texturing (CCG) runs schematically as follows:

- mixing of starting material, $Y_2O_3$, $BaCO_3CuO$ (99.9% pure);
- calcining at 950° C. (24 h);
- high temperature melting at 1200 to 1400° C. and rapid cooling;
- pulverizing with addition of $Ag_2O$ and pressing;
- direct solidification under influence of spatial time-dependent temperature gradients;
- heating and slowly cooling in an oven at 1 to 2° C./h (211)+L→(123); and
- reoxidation.

In this process the distribution of the (211)-phase over the $Y_2O_3$-nuclei and its growth is controlled. In view of what is currently known the homogeneity and size of the (211)-phase is particularly noteworthy in regard to its Pinning properties. An effect of the geometric shape of the (211)-particles on the resulting Pinning force is also conceivable, since the stress occurring at the boundary surface contributes to the Pinning mechanism. Both a spherical shape and also a whisker-like geometry has currently been observed for the (211)-phase.

The differences between the CCG-method and the currently known melt texturing process(FIG. 1) are chiefly:

- changed chemical starting composition,
- lowered temperature profile
- use of pre-treated powder(precursor),
- the special adjustment of the time-dependent gradient and spatial temperature gradients during the growth process.

The optimal thermal gradient of the method is characterized by two parameters:

a) the temperature difference ▲T between the top surface and bottom surface of the pretreaded green sample during the growth procedure; and
b) the geometry of the temperature gradient which determines the nucleation and the alignment of ceramo crystal throughout the YBaCuO blocks for maximum levitation. Typical values of the thermal gradient which are optimal for texture growth are 30 to 60 K/cm.

Currently 20 to 30 mm size, grain boundary-free quasi-crystalline YBaCuO-regions ("ceramo crystal") can be made by the CCG-process. Because of this and their high critical current densities of 3 to $4 \times 10^4$ $A/cm^2$ the superconductor materials produced by the CCG-process have technically useful properties (levitation, B-inclusions).

4. Pinning Centers

The ceramo crystal growth process is based substantially on the following reaction (3):

$$(211)+L \rightarrow (123)+(211)+L \tag{3}$$

$L(BaCuO_2+CuO)$ liquid phase

Thus the portion of (211)-phase essential for the Pinning properties can be controlled via the amount of starting powder. The volume proportion of (211)-phase in the composition $Y_{1.8}Ba_{2.4}Cu_{3.4}O_x$ amounts to 40 atom %. A simple quantitative increase of the (211)-proportion generally does not lead to maximum flux Pinning. The volume size reduction of the superconducting phase (123) with accompanying limitation of $J_c$ contrasts to the positive effect of the greater number of Pinning centers. Thus an optimum (211)/(123) ratio exists. The (211)-phase is favored as the dominant Pinning center in melt-textured YBaCuO in the literature. Also added $BaSnO_3$ particles of from 0.1 to 1 micron in size can increase the effective current density further as described in J. Shimoyama, et al, Jpn.J.Appl.Phys. 29, L 1999(1990). Flux Pinning in (211) deposits can be detected with the help of Bitter techniques. Finely divided Ni-particles are deposited on the surface of a melt-textured YBaCuO sample in the fluxoid in the vicinity of the (211) deposits as described in Y. Higashida, et al, Adv.In Superconductivity IV, 331.

Figure 5:
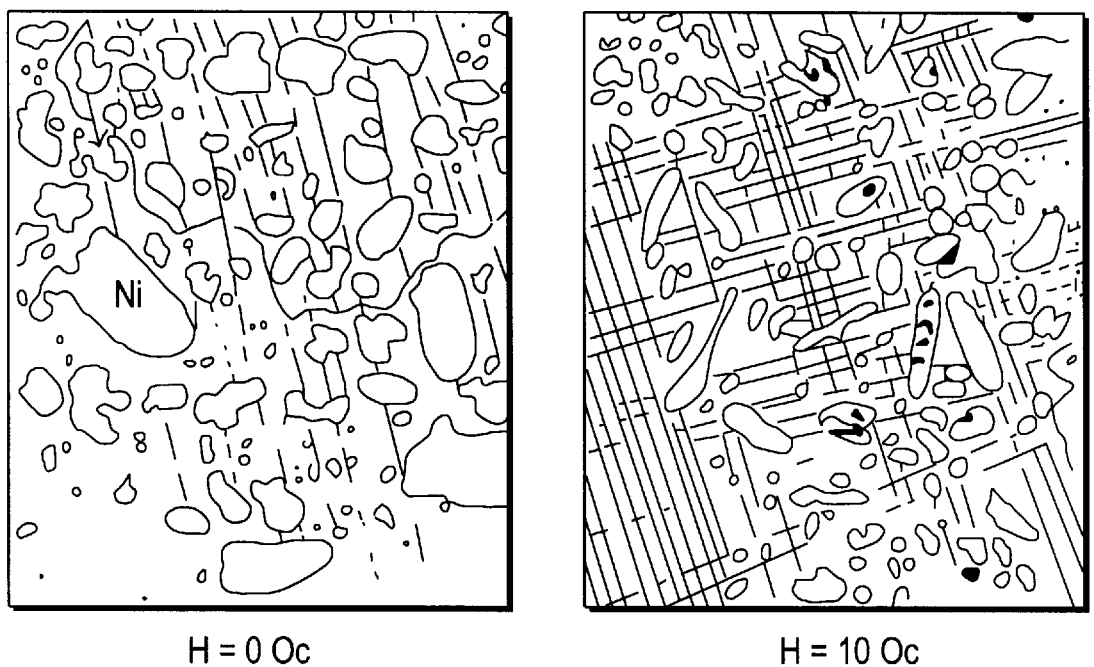
FIG. 5 is an optically polarized photographic view of the surface of melt-textured YBaCuO—(123)/(211) with a Ni decoration at T=10 K.

The Higashida reference also concludes with the aid of FIG. 5 that the magnetic flux is quantized in HTSL and localized in applied fields in the vicinity of the (211)-deposits. The size of the (211)-deposits and the homogeneity of their distribution plays a different role for the Pinning-properties of the new superconductor material. The (211)-deposits are a few tens of microns in size in the MTG-process; the derived QMG (quench and melt growth) process or the PDMG (Platinum Doped Melt Growth) shows the (211)-phase finely distributed in the (123)-matrix. Platinum, rhodium or cerium oxide($CeO_2$) provide suitable nuclei for (211)-growth in the form of smaller more highly dispersed deposits. The $CeO_2$ concentration is about 1 percent by weight. The role of the Pt in melt-textured YBaCuO superconductor material is currently not completely understood.

Figure 6A:
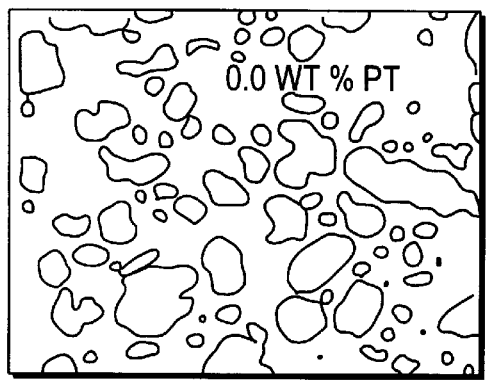
FIG. 6 includes three optically polarized images showing the microstructure of Pt-doped QMG samples.
Figure 6B:
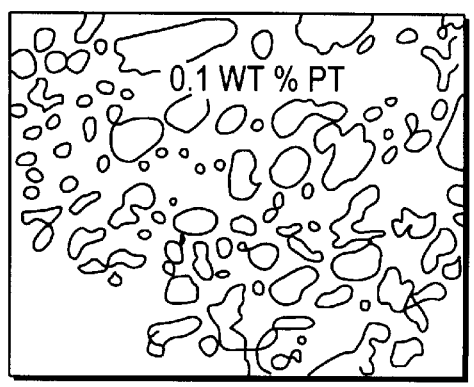
Figure 6C:
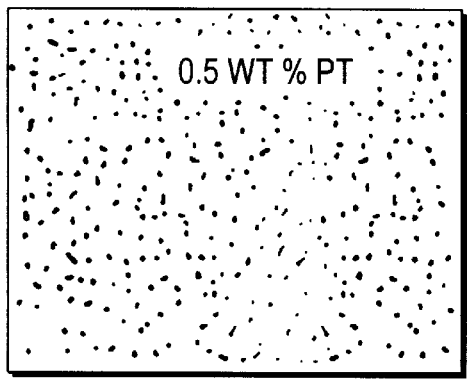

FIG. 6 shows with aid of a polarized microphotograph image that Pt has an obvious influence on the size and distribution of the (211)-deposits in QMG materials. A direct participation of the smallest Pt clusters in the Pinning mechanism of the flux tube in regard to the Pinning mechanism is certainly conceivable. The direct analytical detection of Pt in microscopic amounts has still to be shown.

5. Silver Inclusions

Generally the doping with $Ag_2O$ provides the positive effect of reducing the microcracks in (123)/(211) regions of melt-textured material. The microcracks arise in YBaCuO systems by a tetragonal-to-orthorhomic transformation at about 650° C. The occupation of the O-position in the a- and b-direction with equal probability in the tetragonal phase leads to a reduction of the lattice spacing in the c-direction. Because of that, stresses and cracks arise in the (001)-plane. The latter can be eliminated by the build up of Ag and crack formation can be reduced.

Figure 7:
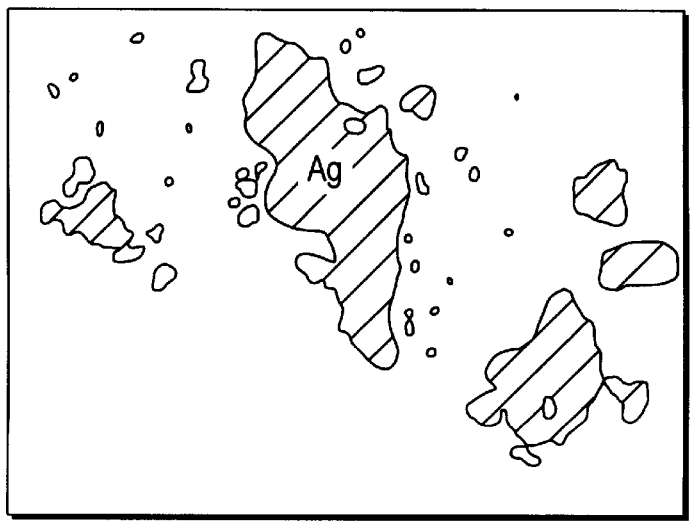
FIG. 7 is a diagrammatic micrograph image showing silver distributed in melt-textured CCG-YBaCuO, bright-field regions: Ag.

The build up of Ag in HTSL does not lead, in contrast to many other dopants, to degradation of the superconductor properties, but to an increase in the conductivity at room temperature and improved diffusion properties for oxygen in (123)-lattices as described in S.Jin, et al, Appl.Phys.Lett. 51, 203(1987) and in B. R. Weinberger, et al, Physica C161, 91(1989). Current silver-doping experiments show that only slight concentrations are built into the lattice. Ag is found primarily in grain boundaries and wedges and as separate deposits of a few tens of microns in extent in entire structure (see FIG. 7).

Besides the Ag distribution experiments presented above in melt-textured (123)-material with electron beam microanalysis(EPMA), high resolution analysis in the nm-region also shows that there is comparatively very small silver enrichment of the material.

Figure 8:
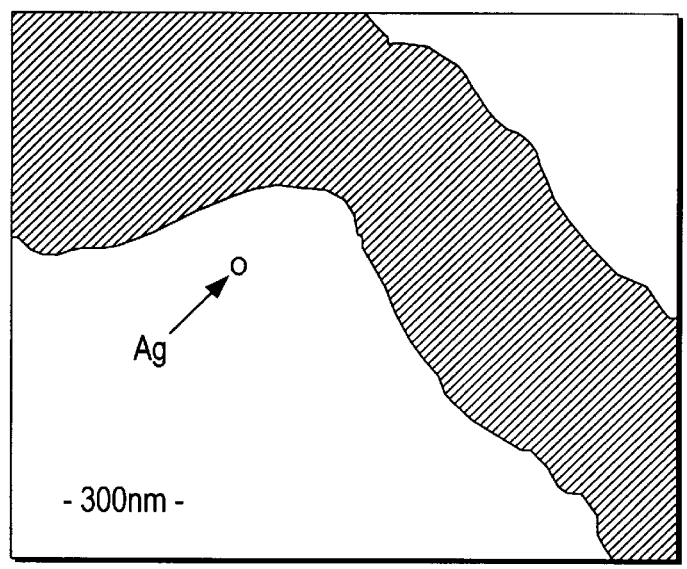
FIG. 8 is a diagrammatic bright-field electron micrograph of CCG material(bright-field region: (211); dark point: Ag)
Figure 9:
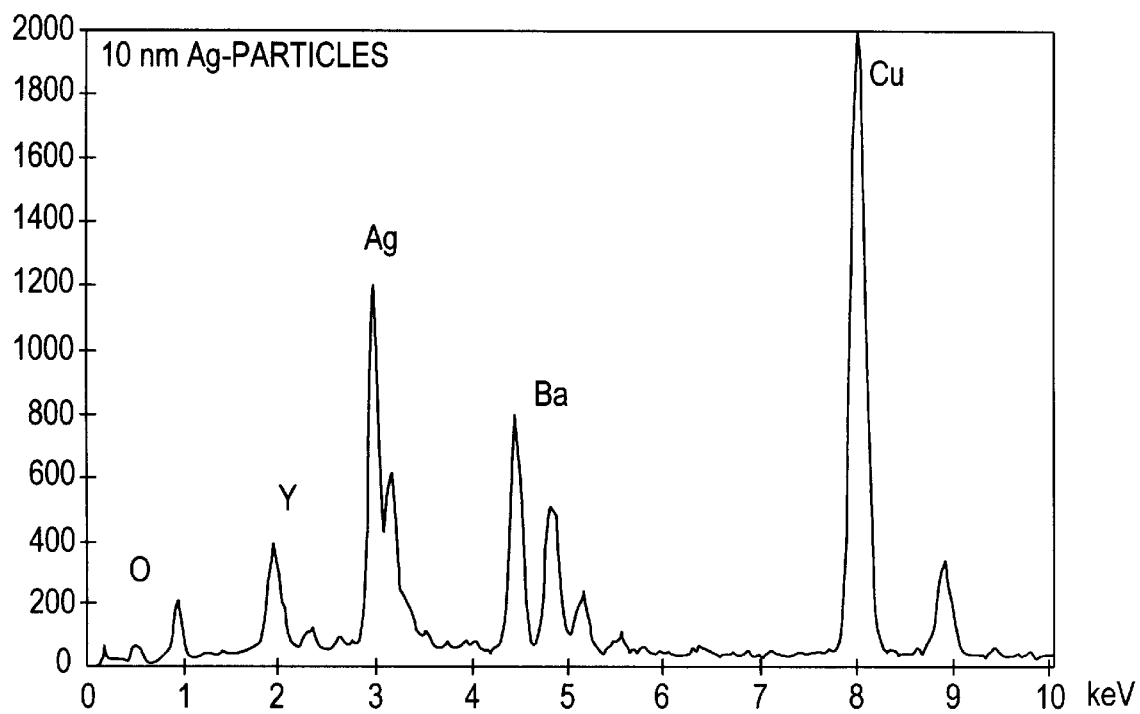
FIG. 9 is an EDX spectrum of 10 nm size particles of the material of FIG. 8: Ag-detected.
Figure 10:
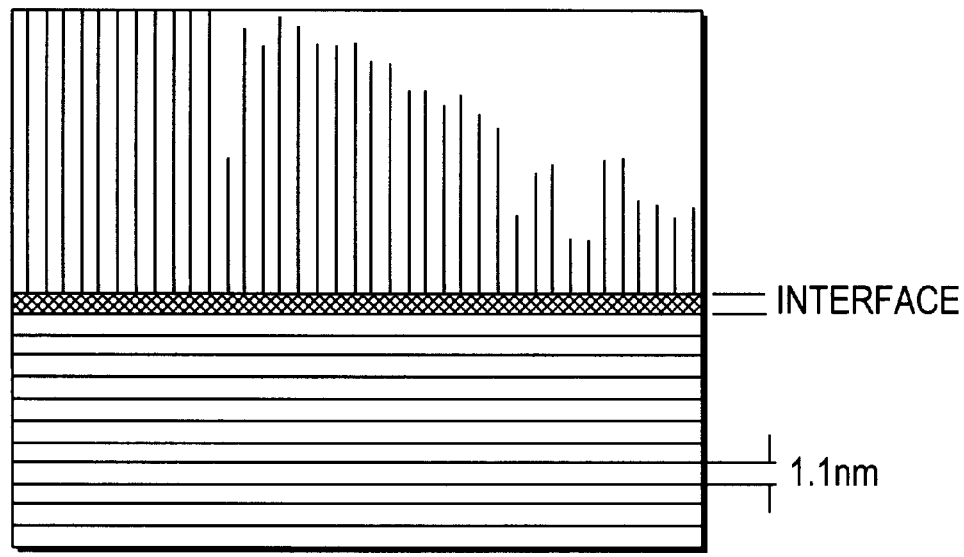
FIG. 10 is a diagrammatic illustration of a boundary surface of a (211) spherical particle with a (123) matrix of CCG-YBaCuO material(magnification:×2 M)

FIG. 8 shows the microstructure of CCG(123)-material in a bright-field transmission electron micrograph. In the finely divided (211)-phase(bright area) there is an approximately 10 nm size Ag particle. The (123)-phase (dark area) has typical twin structures. The analysis of the 10 nm particle of FIG. 9 by analytical electron microscopy shows that the Ag cluster has spherical geometry and contains about $10^3$ atoms (FIG. 10). The occurrence of Ag-deposits in spherical cluster form in the nm range can be an additional source of effective Pinning based on the small coherence length of the new superconductor materials.

6. Microstructure

The ceramo crystal growth method produces a complicated microstructure, whose knowledge is a prerequisite for the understanding the physical process and the desired development of the material. The structural inhomogeneities responsible for the Pinning mechanisms are especially interesting. The predominant published concentration distributions of the (123)-and (211)-phase in micrometer dimensions results, among other things, in scarcely any suggestion of the direct action of (211)-deposits as an Pinning center.

Figure 11:
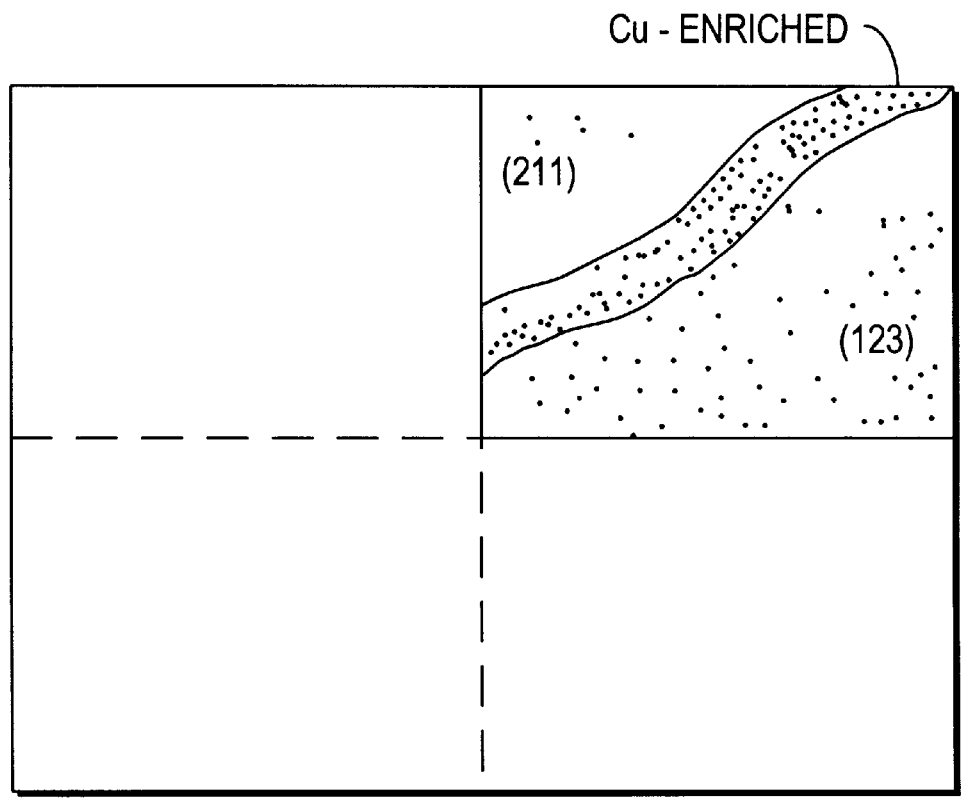
FIG. 11 is a diagrammatic view showing high resolution analytical measurement of the (211)/(123) boundary surface of FIG. 10 showing the Y, Ba and Cu distributions and STEM bright-field image.

FIG. 11 is a diagram of an STEM of a (123)/(211) boundary surface in CCG-YBaCuO. Systematic high resolution observations of of the phase boundary surfaces were made by analytical electron microscopy to determine the significance of the (211)-phase in the (123) superconductor matrix. The preparation of suitable sample elements is very time consuming and expensive with regard to materials, since the samples must transmit electrons (at 100 keV).

The results of FIG. 11 show a Cu-enriched (probably $CuO_x$) interface, which can play a decisive role in providing good Pinning properties of materials.

7. Critical Current Density—Magnetic Field Dependence

The critical current density $J_c$ in HTSL when the (211)-particle is operating as a Pinning center is according to M. Murakami, et al, IEEE Trans.Magn. 27, 1479(1991):

$$J_c = N_p d^2 \xi B_{c2}(1-B/B_{c2})/(\Phi_o B)^{1/2} \tag{4}$$

wherein $N_p$, d=density and size of the (211)-phase,

B=critical field $B_{c2}$=upper critical field $\xi$=coherence length $\Phi_o$=elementary flux quantum.

Figure 12:
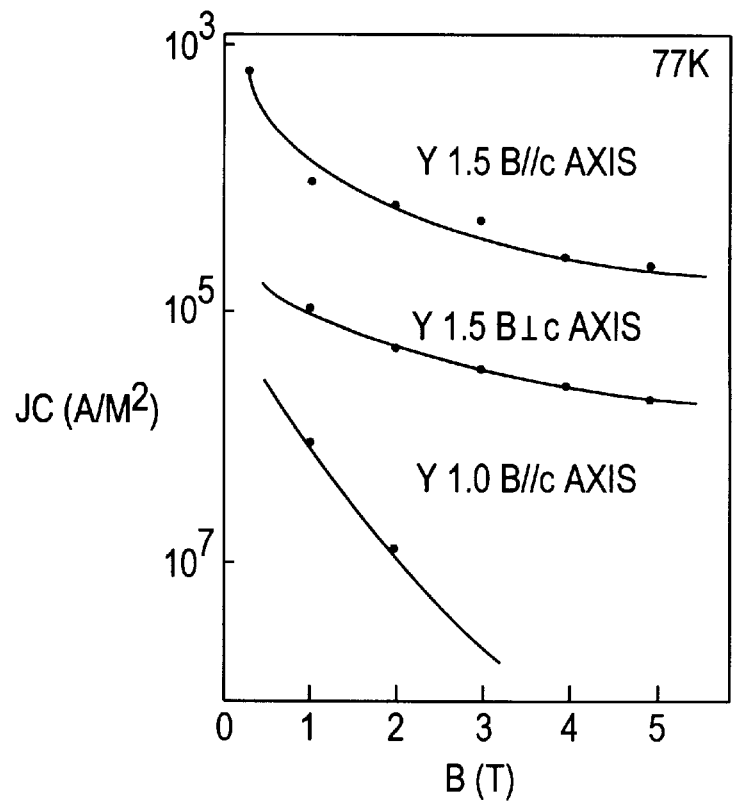
FIG. 12 is a graphical illustration of the magnetic field dependence of the critical current $J_c$ for melt-textured YBaCuO.

The magnetic field dependence of $J_c$ for melt-textured YBaCuO with and without the (211)-phase is shown in FIG. 12. This figure is taken from S. Jin, et al, Appl.Phys.Lett. 51, 203(1987). Both the anisotropy of the critical current density (dependence on the magnetic field direction) and also the higher-by-two-orders-of-magnitude current density for (123)-material with a 25% by volume (211) fraction relative to the pure (123)-phase can be seen in FIG. 12. The action of the (211)-particles as Pinning center is clearly evident because of the reduced magnetic field dependence of the $Y1,5$ samples relative to the $Y_{1,0}$ samples.

8. Flux Creep

The reduction of the critical current density for Type-II superconductor material by flux creep as a function of temperature can be described by the following formula (5) in a thermal activation model (A. Campbell and J. E. Evetts, Adv.Phys. 21, 199(1972)):

$$J_c = J_{co}[1-(kT/U)\ln(\mu_o Hs\Omega/E_c)] \tag{5}$$

wherein $J_{co}$ is the critical current density without thermal activation, H is the magnetic field, s is the spacing between the Pinning centers, $\Omega$ is the oscillation frequency of a flux line and $E_c$ is the minimum of the critical electric field used for the critical current criterion.

The Pinning self-energy per unit length is given by the following equation (6):

$$U = H_c^2/8\pi^*\pi\xi^2 \tag{6}$$

wherein the coherence length $\xi$ for the new superconductor material is small, typically less than 1 to 2 nm in comparison to conventional materials, U for the new superconductor material amounts to about 0.2 eV, and the ratio U/kT (0.0066 eV at 77 K) is about 30. If one takes the same value of 30 for the factor $\ln(\mu_o H1\Omega/E_c)$, then $J_c$ is less than $J_{co}$. Under these conditions the practical utility of the new superconductor oxide material is considerably limited.

Figure 13:
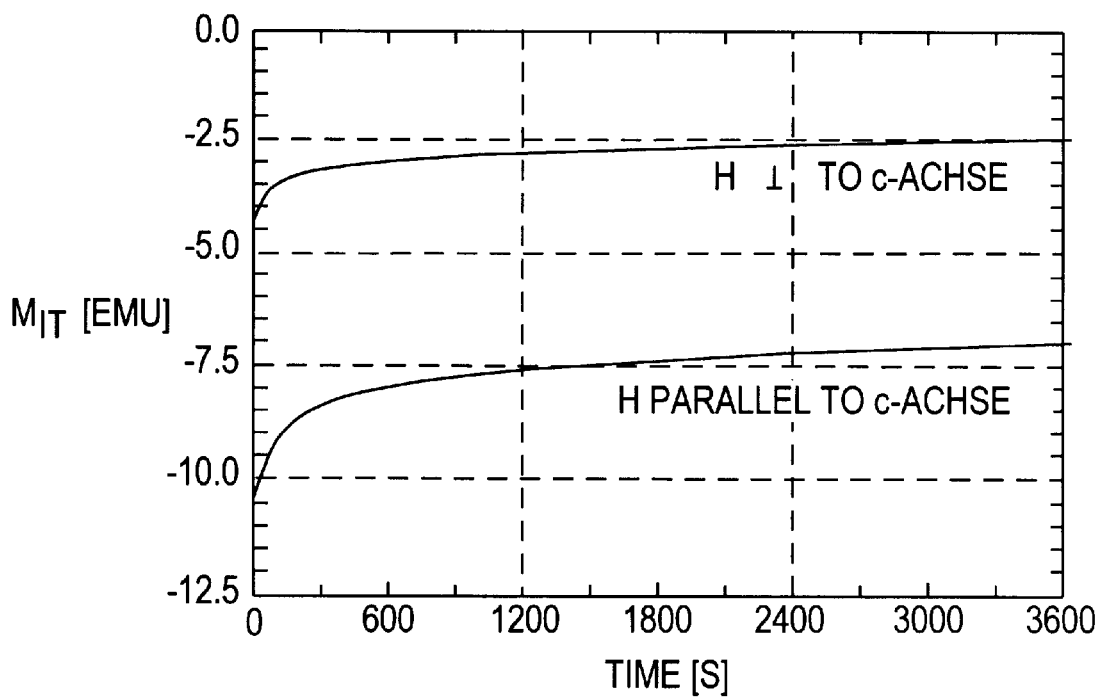
FIG. 13 is a graphical illustration of the relaxation of the magnetic moments parallel and perpendicular to the c-axis in a 1 Tesla magnetic field at 77 K for CCG-material.

The behavior of the melt-textured YBaCuO material is substantially different. The Pinning energy U for QMG and CCG-YBaCuO superconductor material is about a few eV, as determined by the magnetic relaxation behavior. The decrease in magnetization for a cylindrical disk of that material of radius r as a function of the logarithm of the time is given by the following equation (7)(A. Campbell and J. E. Evetts, Adv.Phys. 21, 199(1972)):

$$dM/d\ln t = (J_c r/3c)/(kT/U) \tag{7}$$

wherein c=the speed of light and M=magnetization. According to eqn. (7) it is possible to largely minimize the thermally determined flux defects by a highly effective Pinning mechanism and to keep the decrease in the magnetization very small at $LN_2$ temperature (77 K). FIG. 13 shows the very small drop in magnetization during relaxation in CCG-material.

9. Macroscopic Force Effects

A series of engineering applications of the melt-textured superconductor material are based on the action of forces between the superconductor material and a permanent magnet. The force of repulsion between the superconductor material and a magnet can be used for example to develop and make a superconducting contactless bearing.

Figure 14:
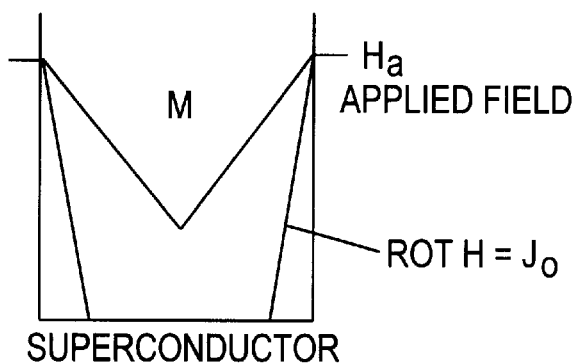
FIG. 14 is a diagrammatic illustration of the field distribution in a superconducting material induced by an external magnetic field $H_a$.

The field distribution in a superconductor material and the resulting diamagnetic shielding by $J_c$ is shown in FIG. 14. In this Figure is m=M V, the magnetization; dM/dz is the gradient of the field strength in the z-direction(abscissa); rot $M=J_c$ the critical current density; and $H_a$=applied field.

The magnetization per unit volume depends on the sample geometry.

$$M = AJ_c r \tag{8}$$

wherein A is a constant and r is the radius of the shielding current loop. The size of the critical current density $J_c$ and the radius of the diamagnetic shielding current are decisive for obtaining the highest possible repulsion force.

Figure 15:
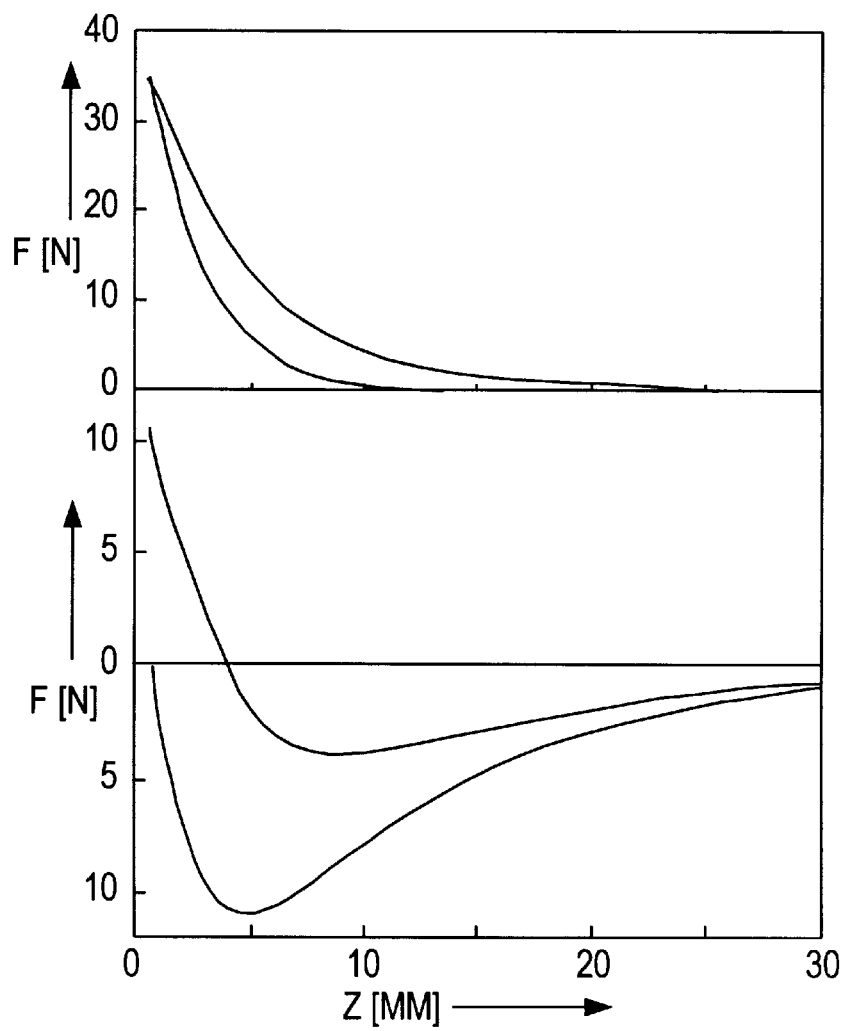
FIG. 15 includes graphical illustrations of the levitation force curve of the zero-field and field-cooled trap: probe SmCo O 25 mm/ 400 mT in 0.5 mm spacing.

The best currently available CCG-(YBaCuO)-material has a grain boundary-free (quasi-crystalline) region of about 20 mm size. The repulsion force of a 39 mm CCG-cylinder by a 0.6 T magnet amounts to about 150 N at a spacing of about 1 mm between these two components. The magnetic repulsion of the superconductor material by a permanent magnet shows a strong hysteresis, which arises because of the characteristic magnetic field distribution in the sample and the diamagnetic behavior. If the magnet is pressed on a superconductor material, the magnetization increases, accompanied by a strong repulsion force between both. A residual magnetization remains in the superconductor after removal of the magnet, which manifests itself in an attractive force component. In this state the superconductor acts as a permanent magnet. FIG. 15 shows the integral levitation force curves for the zero-field and field cooled cases.

Figure 16:
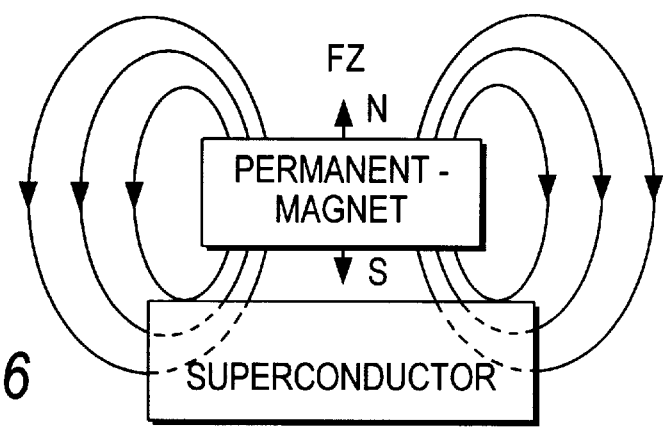
FIG. 16 is a diagrammatic view of a permanent magnet placed on a superconductor material showing the magnetic field of the permanent magnet.

The macroscopic levitation force is based on the size of the enclosed critical magnetic field and the strength of the permanent magnet placed in proximity to the semiconductor material as in FIG. 16.

Fields up to 1 T can be activated in CCG-material on further optimization of the manufacturing process. The use of the superconductor material as a separator device is possible with these anchored magnetic fields. Meanwhile Y. Ren and B. R. Weinstein, in Appl.Phys.Lett.(private communication but submitted as a Journal article recently) report that a magnetic flux of 1.5 T can be obtained by irradiation of melt-textured YBaCuO with light ions.

10. Example: Superconductor Magnetic Bearing

During the superconductor material manufacture the magnetic flux lines in the mixed state(normally conductive region in a superconducting matrix—Shubnikov phase) are anchored by an effective Pinning center, so that the superconductor circular current produces strongly repulsive forces on a permanent magnet. In contrast to the repulsion of two equal magnetic poles (N-N,S-S), the forces acting between the superconductor and the exterior magnet not only oppose further approach of the superconductor and the exterior magnet, but also lateral displacement of one relative to the other or a displacement of one away from the other.

Because of that the new superconductor material provides good prerequisites for its use in a stable bearing for a magnetic rotor. The contact-free and thus friction-free bearing allows an extremely high rotation speed to be developed with reduced driving power. The rotation axis can be selected at will which is particularly advantageous, when the original spatially frozen magnetic flux distribution is overcome and a new flux Pinning is adjusted or set by external forces. The important parameters of an HTSL permanent magnet bearing configuration for practical applications are:

levitation force, $F_z$, static and dynamic stiffness constant, k, damping constant, C, and rotation speed, U.

Figure 17:
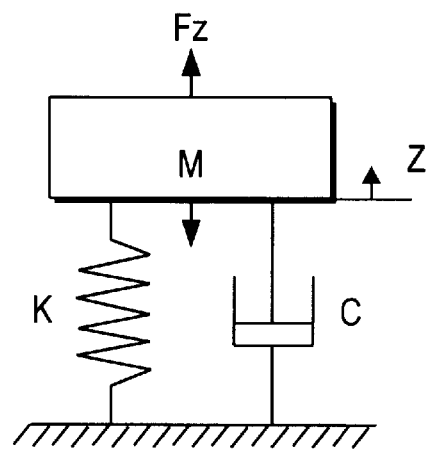
FIG. 17 is a diagram of a model of an HTSL permanent magnet configuration including various parameters.

FIG. 17 shows a diagrammatic illustration of a model of the HTSL permanent magnet configuration illustrating these parameters and their interrelationship.

The equation of motion (9) of this one dimensional model (z-direction) is thus:

$$m\ddot{z}+c\dot{z}+kz=F_z \qquad (9)$$

The levitation pressure determines how much effective force arises for a given effective bearing surface from the available magnetic field strength.

The restoring force or stiffness constant k keeps the permanent magnet in an equilibrium position and determines the eigenfrequencies for the response of the system to a perturbation. During deviations from the above-described oscillatory equilibrium the constant k for the above-discussed superconductor permanent magnet configuration is not constant, but instead is a complicated function of the spacing z between the magnet and the superconductor and of the external magnetic field, $B_a$, according to the following equation (10):

$$k=f(D(z,t),B_a) \qquad (10)$$

Furthermore one may consider that k is approximately simply the following sum (11):

$$k=\Sigma k_i(d_i) \qquad (11)$$

wherein i=the number of quasi-crystals with an average diameter $d_i$. The approximate character of equation (11) must be emphasized, since for example eventual oscillation of the quasi-crystals relative to each other is not considered.

For the dynamical angular stiffness one can take for small deflections x of the rotor:

$$dF/d\Theta=dF/dx/r=m\omega^2 r (\text{centrifugal force}) \qquad (12)$$

wherein r=radius of the circle and x=deflection perpendicular to r.

Figure 18:
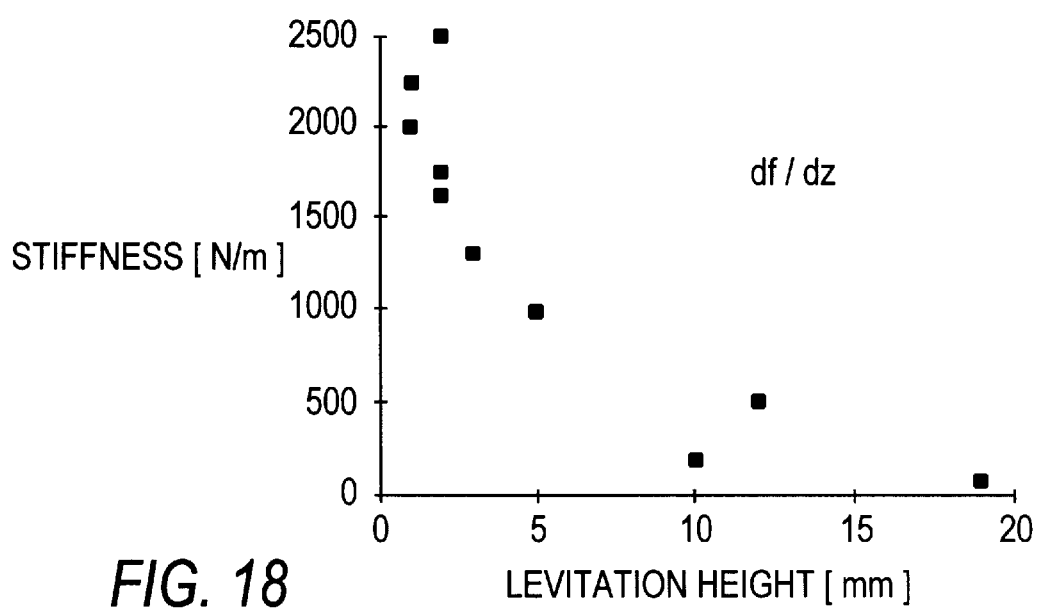
FIG. 18 is a graphical illustration showing axial stiffness as a function of levitation height derived from the levitation curve of FIG. 15.
Figure 19:
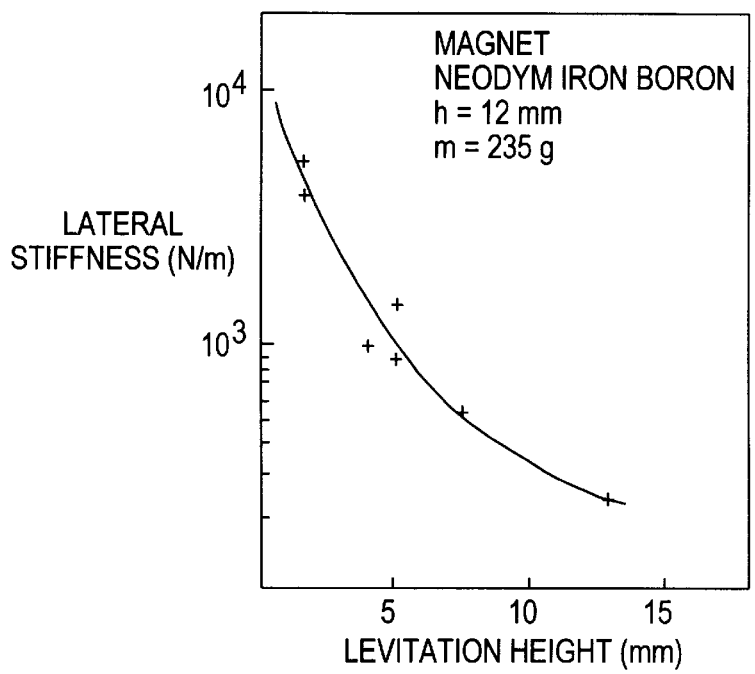
FIG. 19 is a graphical illustration of the experimentally determined stiffness curve of an MTG YBaCuO permanent magnet configuration.

The damping is a comparable variable which determines how fast the rotor returns to the equilibrium position. Also whether a magnetically mounted radially symmetric rotor rotates in fact in a completely friction-free manner (except for friction due to air) over a superconductor is a completely open problem. Small deviations from the axial symmetry could also lead to magnetic friction, which could gradually brake the friction. First qualitative and quantitative values for the rotor stiffness are obtained from the levitation curves (FIG. 15) and/or earlier measurements (G. M. Langbein). The axial stiffness derived from the levitation curve is shown in FIG. 18. The stiffness for a radial deviation and inclination of the rotor are smaller than the axial stiffness as a result(FIG. 19). Servicable magnetic bearings for centrifuges, turbines and turbomolecular pumps can be made with the help of melt-textured YBaCuO ceramic materials.

The superconducting magnet bearing must balance the rotor weight with sufficient safety factors and guarantee a stable bearing for the rotor in all operating conditions of the pump. The diamagnetic behavior of the superconductor is decisive for a stable bearing configuration. This is a consequence of Earnshaws theorem, according to which a stable equilibrium position does not exist for a combination of a permanent and electromagnet(S. Earnshaw, Trans.Camb-.Phil.Soc. 7, 97(1842)). Back coupling systems are always necessary for stability. This back coupling is produced for HTSL by the diamagnetic properties.

The principles of magnetic bearings have been known for a long time. The possible use of these bearings had however a series of disadvantages but these disadvantages can be largely overcome by superconducting bearings. Active magnetic bearing systems require a significant and expensive electronic system for observation and control. In principle no regulation is required in passive systems made from permanent magnets for rotors and stators. Of course at least one rotation axis must be stabilized since a bearing made only from permanent magnets is unstable.

The advantages of a superconducting magnetic bearing for a UHV turbomolecular pump are:

absolute freedom from lubricants, reduced vibration and noise generation (useful in oscillation sensitive applications), reduced drive performance, vacuum-tight separation of the bearing of the rotor, absolute oil freedom of the pump, increase in the rotation speed (mechanical stability of the rotor defines the limiting speed), arbitrary mounting location, and structural coupling possible in the $LN_2$ cooling case.

The special bearing structure and requirement for continuous supply of the bearing with liquid nitrogen are an engineering problem which must be solved so that a useful bearing can be produced. An essential prerequisite for reliable and trouble-free operation of a contactless, self-centering superconductor bearing is that position stability can be achieved in the required rotation speed range of the rotor. Some information regarding this can be obtained by experiments to determine the effective radial and axial forces. For a special geometry of superconductor and magnet tuned to the bearing configuration the obtained values provide a fundamental hope that the necessary high position stability for rapid rotation can be attained in the range of less than 10 micrometers.

Figure 20:
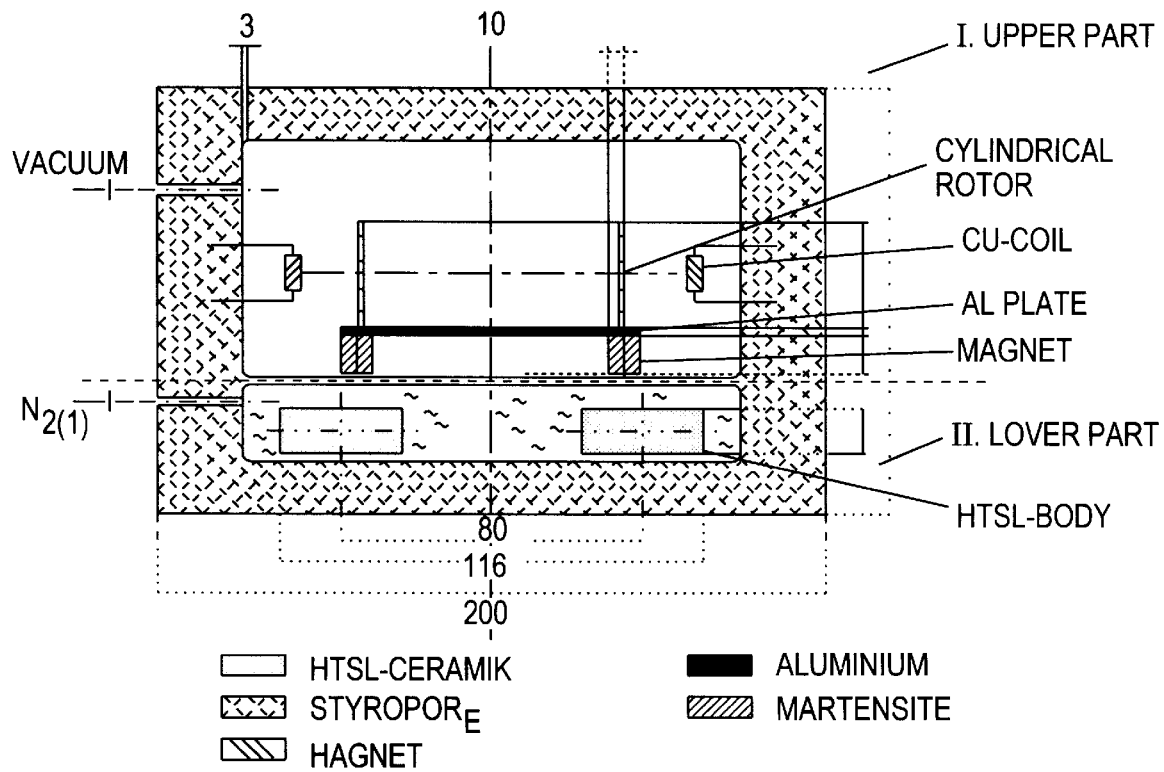
FIG. 20 is a schematic cross-sectional view through a free-running HTSL permanent magnet configuration.

An example of a free-running HTSL permanent magnet configuration is shown in FIG. 20. A multipole coil acts as generator.

A variety of solutions for the problem of supplying high temperature superconductors with liquid nitrogen have been made. The supply with. $LN_2$ can occur by a specially developed Dewar containing system (double walled V4A model). It is also possible to provide a direct $LN_2$ cooling of the melt-textured superconductor HTSL ceramic material and an indirect cooling by a finger connected with a Cu-matrix.

Figure 21:
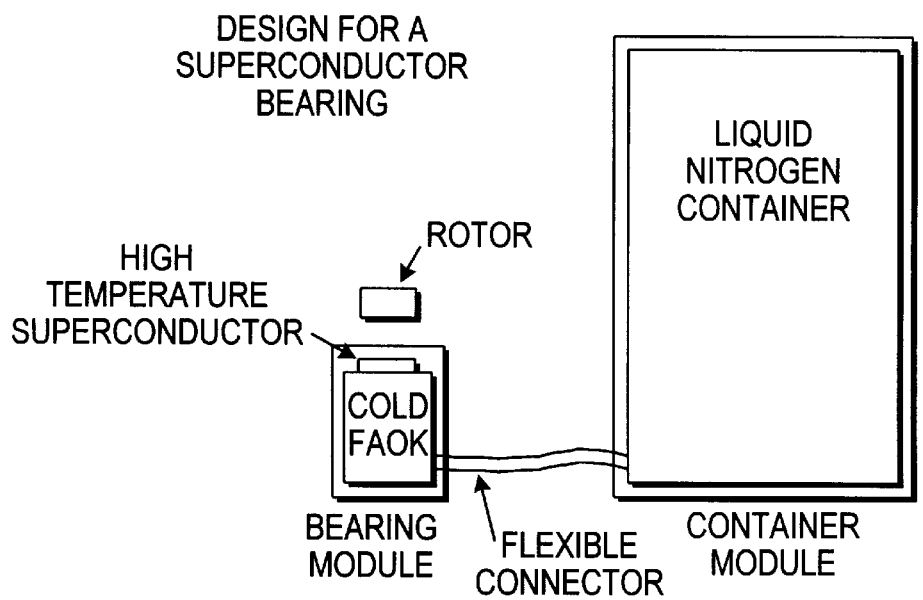
FIG. 21 is a diagrammatic cross-sectional view through a liquid nitrogen-cooled superconductor bearing.
Figure 22:
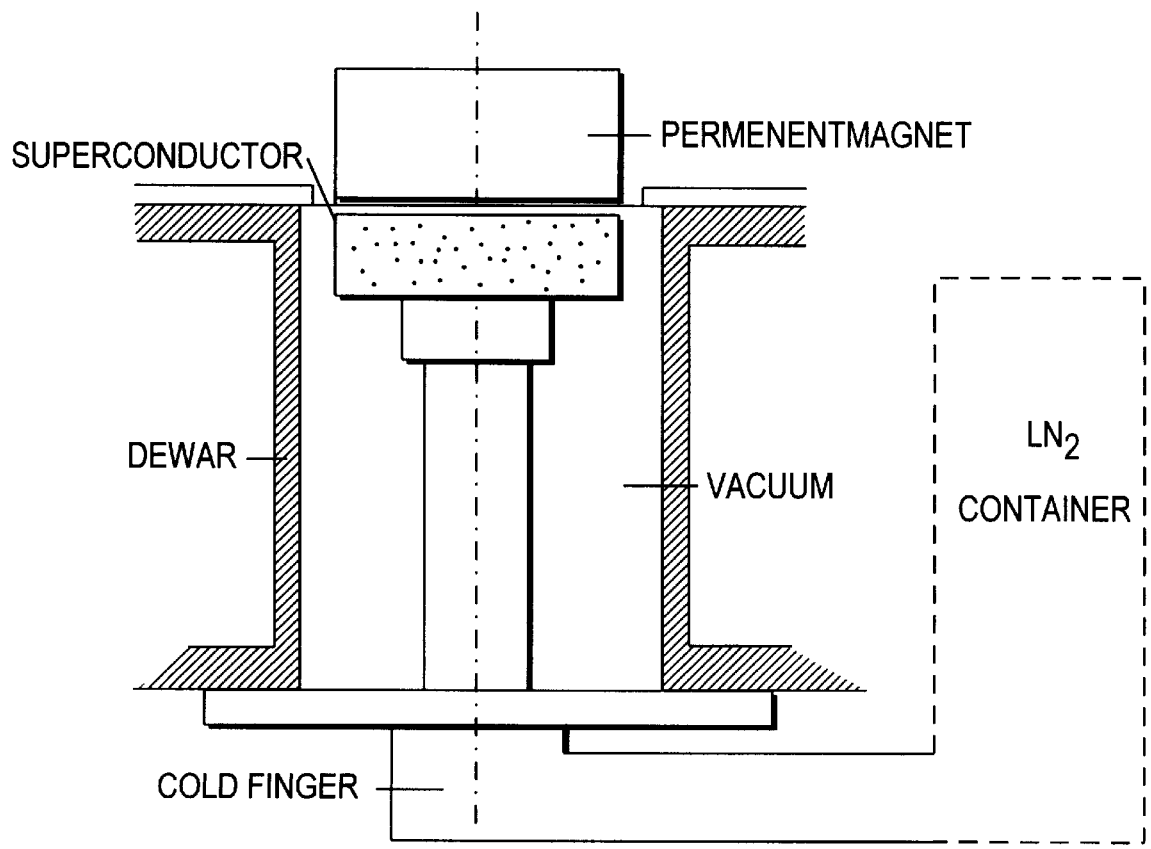
FIG. 22 is another diagrammatic cross-sectional view through a liquid nitrogen-cooled superconductor bearing illustrating the principles of the device.

In a second embodiment certain aspects are improved including the thermal stability and the operating reliability (Buffering of rapid thermal fluctuations). See FIGS. 21 and 22.

11. Example of Use

Figure 24:
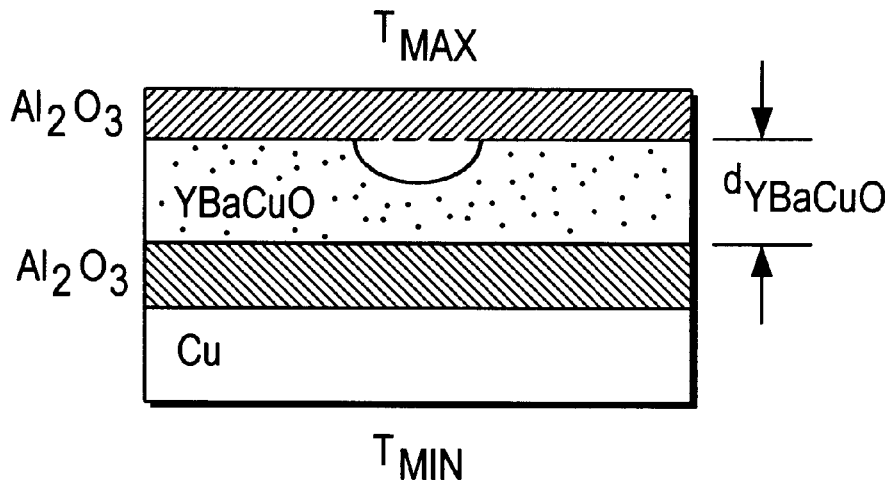
FIG. 24 is a diagrammatic cross-sectional view showing the establishment of a temperature gradient.
Figure 25:
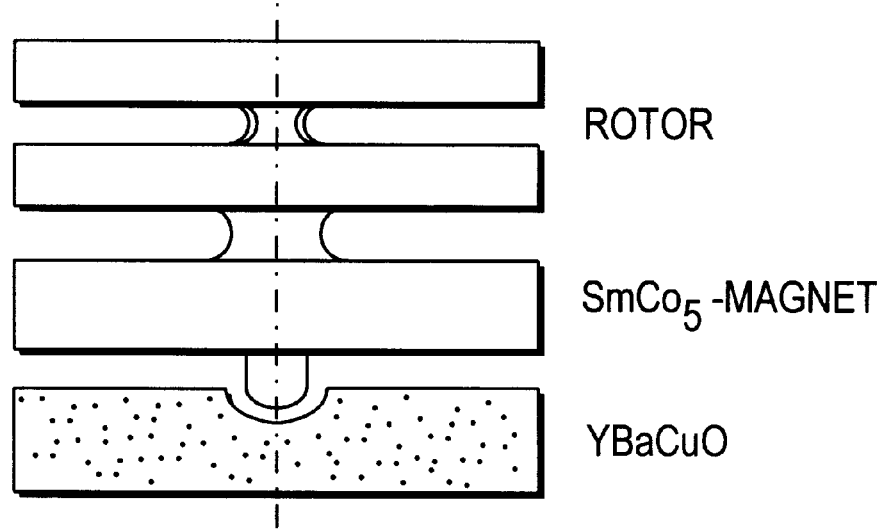
FIG. 25 is a diagrammatic cross-sectional view of a superconductor material magnetic bearing.
Figure 23:
FIG. 23 is a diagrammatic cross-sectional view showing the geometry of a superconductor material body with the required bearing depression.

The heat treatment method described below were modified in the following way in the following application:

The molded body made from YBaCuO used as a blank in this application is adapted and/or designed so that the processing necessary for making the bearing element can be minimized. FIG. 23 shows the geometry of the superconductor-molded body with the required central bearing depression for the bearing application. The molded body is provided in a growing process with a plate or foil heater on both sides, and on its lower side with a Cu-block as a thermal buffer, which is connected with the coldest position of the oven at a temperature $T_{min}$. See FIG. 24. The resulting temperature gradient across the superconductor material is $(T_{max} - T_{min})/d_{YBaCuO}$.

The temperatures $T_{max}$ and $T_{min}$ can be individual adjusted by a separate energy supply and thus the heat treatment of the solid YBaCuO sample can be optimized. The cooling of the sample should occur under controlled oxygen atmosphere. During the stepwise cooling of the sample with a holding time and a total cooling ramp of 1200° C., a continuous comparison between the measured temperatures and the predetermined set temperature curve is made so that the cooling process can be controlled so that the temperature at the upper side of the sample corresponds to the oven temperature and/or the desired optimum temperature gradient is set up across the sample (method of Differential Thermal analysis-DTA Method).

After cooling to room temperature the sample comprises a superconducting ceramic material of high current density with embedded quasi-crystals. The transition or jump temperature for the superconducting condition or state is from 91 to 92 K.

The sample made in the above manner is the stationary part of a superconductor magnet bearing system (Stator) and is provided with a permanent magnet of a higher remanence. The permanent magnet supports a rotor, which can be driven by a coil system. Several critical rotation speeds are traversed during rapid running of the rotor whereby the diamagnetic coupling between the superconductor and the magnets of the rotor is dynamically stabilized. The cooling of the superconductor is performed by a Dewar system with an $LN_2$ reservoir and cold finger. The rotor is caught by the bearing in the superconductor during heating up.

While the invention has been illustrated and described as embodied in a method of making a high temperature superconductor material, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of making a high temperature superconducting material for a magnetic field generating device, the high temperature superconducting material having a multi-phase yttrium barium copper oxide composition and a melt-textured structure, the method comprising the steps of:

providing a base material having two opposing surfaces, and comprising a $YBa_2Cu_3O_{7-x}$ (123) composition with silver oxide;

controlling a temperature of each of said opposing surfaces, thereby providing a time-dependent spatial temperature gradient across said base material from one of said opposing surfaces to the other of said opposing surfaces;

measuring said time-dependent spatial temperature gradient, and determining whether the measured time-dependent spatial temperature gradient is within a desired range; and controlling said time-dependent spatial temperature gradient such that said time-dependent spatial temperature gradient remains within said desired range, thereby melt-texturing said base material while:

(i) decomposing said silver oxide into silver, and (ii) transforming said base material into quasi-crystalline superconducting regions having said $YBa_2Cu_3O_{7-x}$ (123) composition, intrinsically non-superconducting material zones having a $Y_2BaCuO_5$ (211) composition, and copper-enriched interfacial layers between the quasi-crystalline superconducting regions and the non-superconducting material zones, thereby providing a superconductive material, and then cooling said superconductive material, thereby providing a superconducting material having silver inclusions, the superconducting material having said quasi-crystalline superconducting regions separated from said non-superconducting material zones by said copper-enriched interfacial layers, wherein the copper-enriched interfacial layers function as pinning centers and the superconducting material can carry a current of at least $3 \times 10^4$ ampere per $cm^2$ at a temperature of 77 K in an external magnetic field of one Tesla.

2. The method according to claim 1, wherein the measuring step includes measuring said time-dependent spatial temperature gradient with a differential-thermal analysis device, and the step of controlling said time-dependent spatial temperature gradient includes adjusting said time-dependent spatial temperature gradient in a growth oven.

3. The method according to claim 1, wherein the providing step includes the following sub-steps:

mixing $BaCO_3$, $Y_2O_3$ and copper oxide, thereby providing a mixture;

calcining said mixture at about 950° C.; then melting said mixture at a temperature from about 1200° C. to 1400° C., thereby providing a molten mixture; then cooling said molten mixture, thereby providing a solidified mass; then pulverizing said solidified mass while adding silver oxide thereto, thereby providing a powder; and then pressing said powder into a body.

4. A method of making a high temperature superconductor, comprising the steps of:

providing a material comprising a $YBa_2Cu_3O_{7-x}$ (123) composition with silver oxide;

molding said material into a body having two opposing surfaces;

providing on one of said two opposing surfaces a monting member made of one of copper and aluminum; then controlling a temperature of each of said opposing surfaces, thereby providing a time-dependent spatial temperature gradient across said body from one of said opposing surfaces to the other of said opposing surfaces;

measuring said time-dependent spatial temperature gradient, and determining whether the measured time-dependent spatial temperature gradient is within a desired range; and controlling said time-dependent spatial temperature gradient such that said time-dependent spatial temperature gradient remains within said desired range, thereby melt-texturing said body while.

(i) decomposing said silver oxide into silver, and (ii) transforming said body into quasi-crystalline superconducting regions having said $YBa_2Cu_3O_{7-x}$ (123) composition, intrinsically non-superconducting material zones having a $Y_2BaCuO_5$ (211) composition, and copper-enriched interfacial layers between the quasi-crstalline superconducting regions and the non-superconducting material zones, thereby providing a superconductive material, and then cooling said superconductive material, thereby providing a superconducting material having silver inclusions, the superconducting material having said quasi-crstalline superconducting regions separated from said non-superconducting material zones by said copper-enriched interfacial layers, wherein the copper-enriched interfacial layers function as pinning centers and the superconducting material can carry a current of at least $3 \times 10^4$ ampere per $cm^2$ at a temperature of 77 K in an external magnetic field of one Tesla.

5. The method as defined in claim 4, further comprising filling any cracks, slots and hollow spaces formed between the molded body and the mounting member with a resin.

6. The method as defined in claim 4, wherein said molded body has a diameter and a height and a ratio of said diameter to said height is four to one.

* * * * *